(12) United States Patent
Huang et al.

(10) Patent No.: US 9,627,258 B1
(45) Date of Patent: Apr. 18, 2017

(54) METHOD OF FORMING A CONTACT

(71) Applicant: Taiwan Semiconductor Manufacturing Co., Ltd., Hsin-Chu (TW)

(72) Inventors: Yu-Lien Huang, Hsinchu County (TW); Li-Te Lin, Hsinchu (TW); Yuan-Hung Chiu, Taipei (TW); Han-Yu Lin, Hsin-Chu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/183,452

(22) Filed: Jun. 15, 2016

(51) Int. Cl.
*H01L 21/00* (2006.01)
*H01L 21/768* (2006.01)
*H01L 21/311* (2006.01)
*H01L 21/3213* (2006.01)
*H01L 21/3115* (2006.01)
*H01L 23/522* (2006.01)
*H01L 27/11* (2006.01)

(52) U.S. Cl.
CPC .. *H01L 21/76897* (2013.01); *H01L 21/31111* (2013.01); *H01L 21/31116* (2013.01); *H01L 21/31144* (2013.01); *H01L 21/31155* (2013.01); *H01L 21/32135* (2013.01); *H01L 21/7681* (2013.01); *H01L 23/5226* (2013.01); *H01L 27/1104* (2013.01)

(58) Field of Classification Search
CPC ........... H01L 21/6897; H01L 21/31111; H01L 21/31144; H01L 21/31155; H01L 21/32135; H01L 21/7681; H01L 23/5226; H01L 27/1104
See application file for complete search history.

(56) References Cited

U.S. PATENT DOCUMENTS

| | | | |
|---|---|---|---|
| 7,667,271 B2 | 2/2010 | Yu et al. | |
| 7,910,453 B2 | 3/2011 | Xu et al. | |
| 7,947,588 B2 * | 5/2011 | Yu | H01L 21/823842 257/E21.635 |
| 8,211,775 B1 * | 7/2012 | Ma | H01L 29/4983 257/E21.444 |
| 8,377,779 B1 | 2/2013 | Wang | |
| 8,399,931 B2 | 3/2013 | Liaw et al. | |
| 8,652,894 B2 | 2/2014 | Lin et al. | |
| 8,685,516 B2 | 4/2014 | Gifford et al. | |
| 8,716,765 B2 | 5/2014 | Wu et al. | |

(Continued)

*Primary Examiner* — Nicholas Tobergte
(74) *Attorney, Agent, or Firm* — Haynes and Boone, LLP

(57) ABSTRACT

A method includes forming a first gate structure in a dielectric layer over a substrate, wherein the first gate structure includes a first gate stack and spacers along sidewalls of the first gate stack; recessing the first gate stack to form a first trench defined by the spacers, wherein upper portions of the spacers are exposed within the first trench; forming a first capping layer in the first trench, wherein the first capping layer has a first portion disposed along sidewalls of the upper portions of the spacers and a second portion disposed over the recessed first gate stack; applying a first implantation to convert the second portion of the first capping layer into a second capping layer; selectively removing the first portion of the capping layer to expose the upper portions of the spacers; and selectively removing the upper portions of the spacers.

20 Claims, 19 Drawing Sheets

(56) References Cited

U.S. PATENT DOCUMENTS

| | | |
|---|---|---|
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,093,559 B2* | 7/2015 | Ng .................... H01L 29/66545 |
| 9,105,490 B2 | 8/2015 | Wang et al. |
| 2010/0078733 A1* | 4/2010 | Masuoka .......... H01L 21/28088 257/384 |
| 2013/0112937 A1* | 5/2013 | Bangsaruntip ......... B82Y 10/00 257/9 |
| 2014/0001574 A1 | 1/2014 | Chen et al. |
| 2014/0110755 A1 | 4/2014 | Colinge |
| 2014/0151812 A1 | 6/2014 | Liaw |
| 2014/0154877 A1* | 6/2014 | Besser ................ H01L 29/4966 438/586 |

\* cited by examiner

METHOD OF FORMING A CONTACT

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. One area is the wiring, or interconnects, between the transistors and other devices. Although existing methods of fabricating IC devices have been generally adequate for their intended purposes, they have not been entirely satisfactory in all respects. For example, challenges rise to develop robust processed for forming source/drain contacts.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
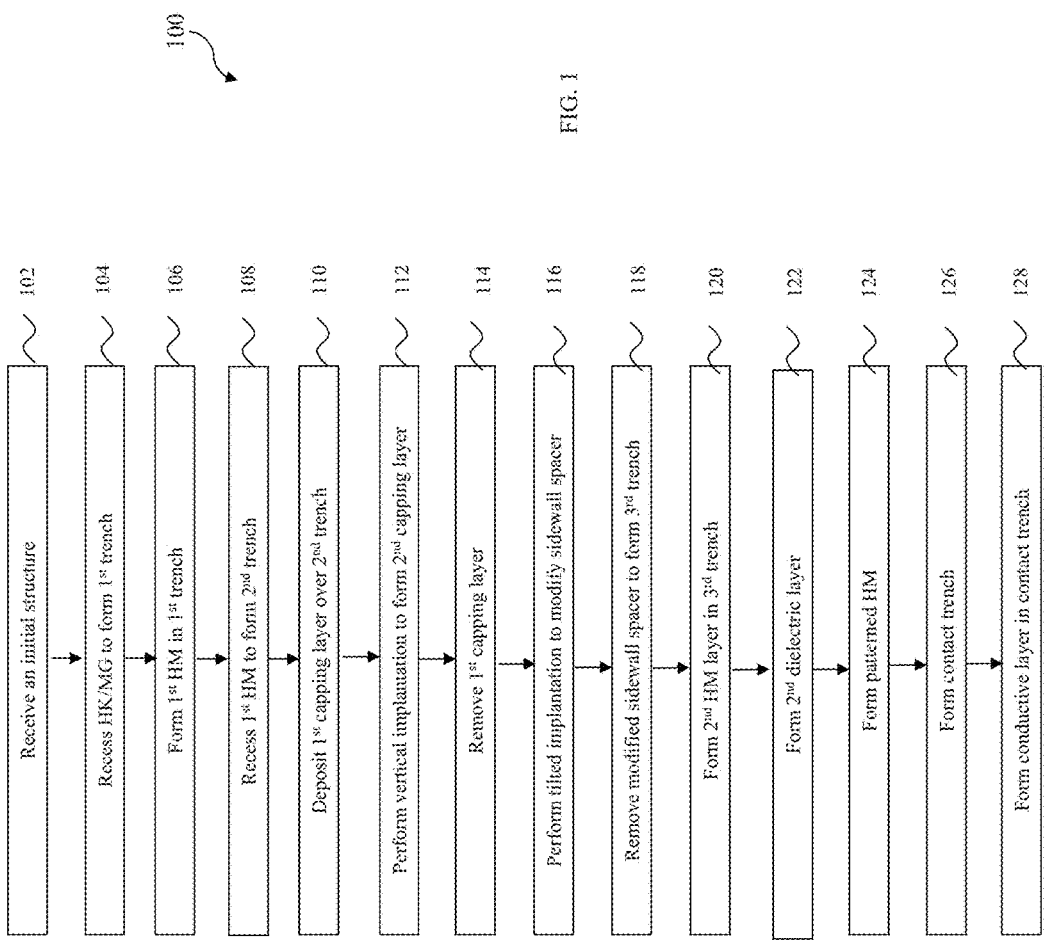
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor device in accordance with some embodiments. The method 100 is discussed in detail below, with reference to an initial structure 205 of a semiconductor device 200 shown in FIG. 2 and the semiconductor device 200 shown in FIGS. 3 through 16B. The device 200 may be an integrated circuit (IC), or a portion thereof, that may comprise static random access memory (SRAM) and/or other logic circuits, passive components such as resistors, capacitors, and inductors, and active components such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, high frequency transistors, other memory cells, and/or combinations thereof. The device 200 may include three-dimensional devices and multi-gate devices such as double gate FETs, FinFETs, tri-gate FETs, omega FETs, and gate-all-around (GAA) devices including vertical GAA devices and horizontal GAA devices.

Figure 2:
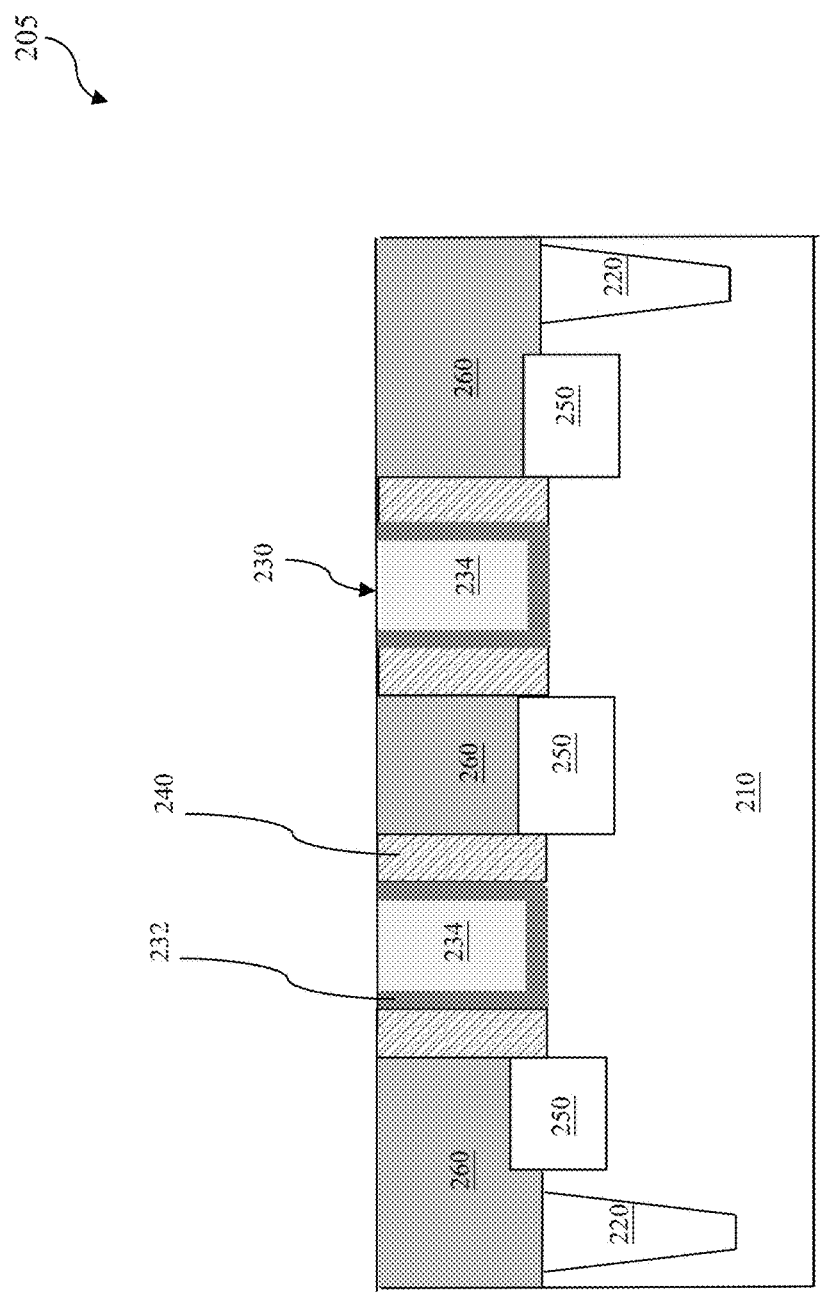
FIG. 2 is a cross-sectional view of an initial structure of an example semiconductor device in accordance with some embodiments.

Referring to FIGS. 1 and 2, the method 100 begins at step 102 by receiving the initial structure 205 of the semiconductor device 200. The initial structure 205 includes a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary initial structure 205, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The initial structure 205 also includes a plurality of first conductive features 230 over the substrate 210. In some embodiments, the first conductive feature 230 may be gate structures including high-k/metal gates (HK/MG). Alternatively, in some embodiment, the first conductive feature 230 may also include a portion of the interconnect structure, such as a contact, a metal via, and/or metal line. In one embodiment, the first conductive features 230 include electrodes, capacitors, resistors and/or a portion of a resistor. For the purpose of simplicity and clarity, the first conductive feature 230 is referred to as the HK/MG 230 hereinafter.

The HK/MGs 230 may include a HK dielectric layer 232 and MG electrode 234. The HK dielectric layer 232 may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The HK dielectric layers may be deposited by a suitable method, such as chemical vapor deposition (CVD), atomic layer deposition (ALD), thermal oxidation or ozone oxidation, other suitable technique, and/or a combination thereof.

The MG electrode 234 may include a single layer or multi layers, such as a metal layer, a liner layer, a wetting layer, and an adhesion layer. The MG electrode 234 may include materials such as Ti, Ag, Al, TiAlN, TaC, TaCN, TaSiN, Mn, Zr, TiN, TaN, Ru, Mo, Al, WN, Cu, W, and/or any suitable materials. The MG may be formed by ALD, physical vapor deposition (PVD), CVD, and/or other suitable process.

In some embodiment, dummy gate stacks are formed first and then are replaced later by HK/MGs 230 after high thermal temperature processes are performed, such as thermal processes during sources/drains formation. The dummy gate stack may include a dummy gate dielectric layer and a polysilicon layer and may be formed by deposition, patterning and etching processes.

The initial structure 205 also includes sidewall spacers 240 formed along the sidewalls of the HK/MGs 230. The sidewall spacers 240 may include silicon oxide, silicon nitride, silicon carbide, silicon oxynitride, and/or other suitable material. In the present embodiment, the sidewall spacers 240 include a dielectric material having a dielectric constant (k) lower than thermal silicon oxide (therefore referred to as low-k dielectric material layer), such as silicon oxide carbide (SiOC), silicon oxide carbide nitride (SiOCN) and/or carbon-doped silicon oxide (SiOCH). The sidewall spacers 240 may be formed by depositing a sidewall spacer layer and then anisotropic dry etching the sidewall spacer layer.

The initial structure 205 also includes second conductive features 250 over the substrate 210. The second conductive feature 250 may be formed by processes such as deposition, photolithography and etch. In some embodiments, the second conductive features 250 are source/drain (S/D) features, beside and separated by the HK/MG 230. The S/D features 250 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. Here, one of the S/D features 250 is a source feature and another of the S/D features 250 is a drain feature. As shown, the S/D features 250 are separated by the HK/MG 230. In one embodiment, a portion of the substrate 210, beside the HK/MG 230 is recessed to form S/D recesses and then the S/D features 250 are formed over the S/D recesses by epitaxial growing processes, such as CVD, VPE and/or UHV-CVD, molecular beam epitaxy, and/or other suitable processes. One or more annealing processes may be performed to activate dopants. The annealing processes comprise rapid thermal annealing (RTA) and/or laser annealing processes.

Alternatively, in some embodiment, the second conductive feature 250 may also include a portion of the interconnect structure, such as a contact, metal via, or metal line. In one embodiment, the first conductive features 250 include electrodes, capacitors, resistors or a portion of a resistor. For the purpose of simplicity and clarity, the second conductive feature 250 is referred to as the S/D features 250 hereinafter.

In the present embodiment, the initial structure 205 includes a first dielectric layer 260 deposited over the substrate 210. As shown, the first dielectric layer 260 is formed such that it surrounds and fills in spaces between HK/MGs 230 such that a portion of the S/D features 250 are embedded in the first dielectric layer 260. The first dielectric layer 260 may include silicon oxide, silicon oxynitride, and/or other suitable dielectric material layer. The first dielectric layer 260 may include a single layer or multiple layers. The first dielectric layer 260 may be deposited by CVD, ALD and/or spin-on coating.

Figure 3:
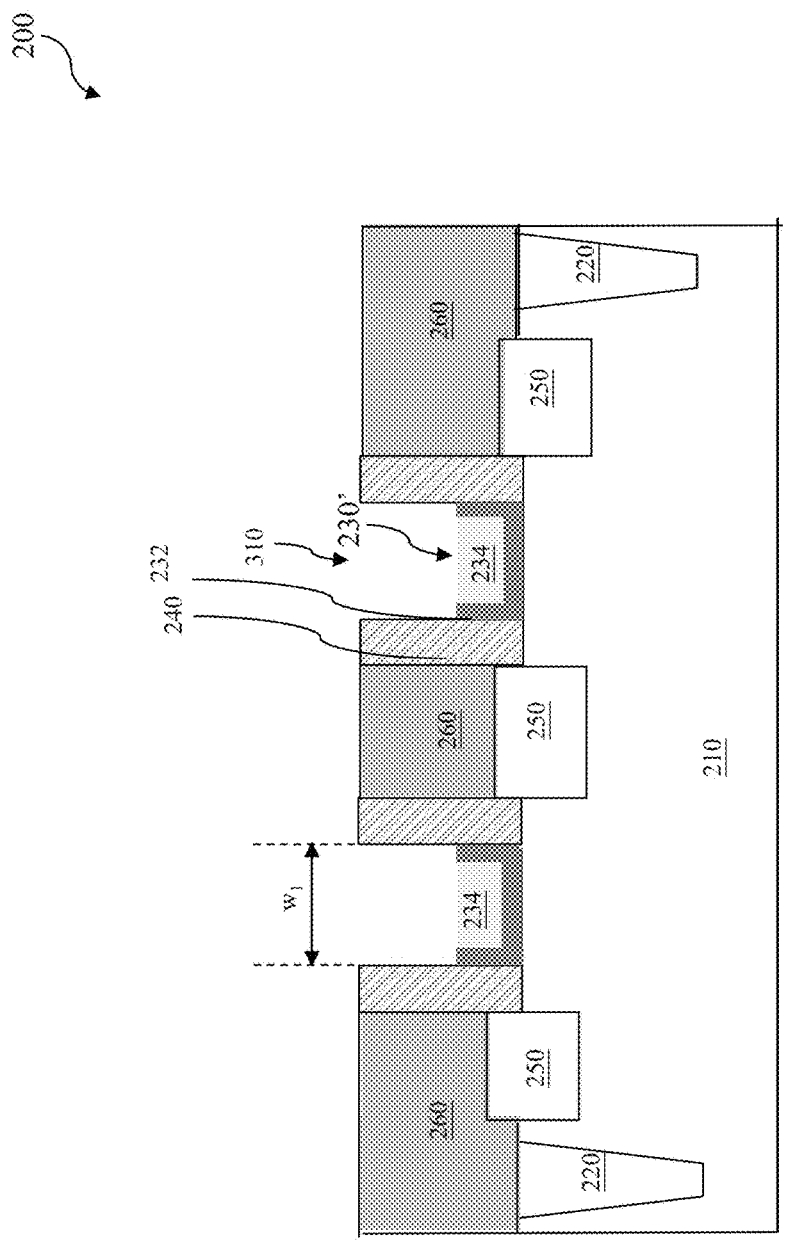
FIGS. 3, 4, 5, 6, 7, 8, 9, 10, 11, 12, 13, 14A, 14B, 15A, 15B, 16A and 16B are cross-sectional views of an example semiconductor device in accordance with some embodiments.

Referring to FIGS. 1 and 3, once the initial structure 205 is received, the method 100 proceeds to step 104 by recessing the HK/MG 230 to form first trenches 310. The remaining HK/MG 230 is referred to as recessed HK/MGs 230' hereafter. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), iodine-containing gas, other suitable gases and/or plasmas, and/or combinations thereof. In some embodiments, the etch process is chosen to selectively etch the HK/MGs 230 without substantially etching the sidewall spacers 240 and the first dielectric layer 260. The first trenches 310 have a first width $w_1$. A portion of the sidewall spacers 240 is exposed in the first trench 310.

Figure 4:
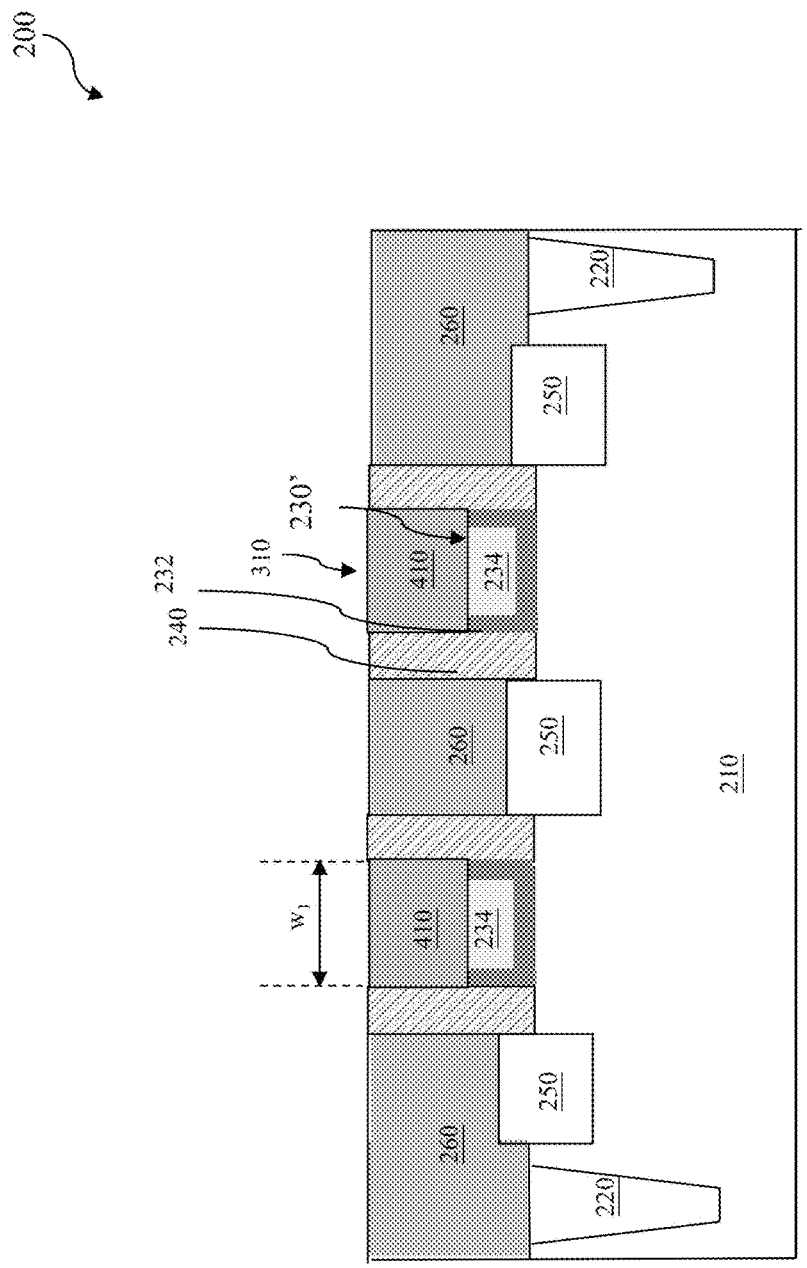

Referring to FIGS. 1 and 4, method 100 proceeds to step 106 by forming a first hard mask (HM) 410 in the first trenches 310. The first HM 410 may include silicon nitride, silicon carbide, silicon oxynitride, and/or other suitable material. In the present embodiment, the first HM 410 includes a material which is different from the first dielectric layer 260 to achieve etching selectivity during subsequent etch processes. In an embodiment, the first HM 410 includes silicon nitride while the first dielectric layer includes silicon oxide. The first HM 410 may be deposited by CVD, ALD, and/or other proper technique. Additionally, a chemical mechanical polishing (CMP) is performed to recess the excessive first HM 410. The remaining first HM 410 has a width, which is the same as the first width $w_1$.

Figure 5:
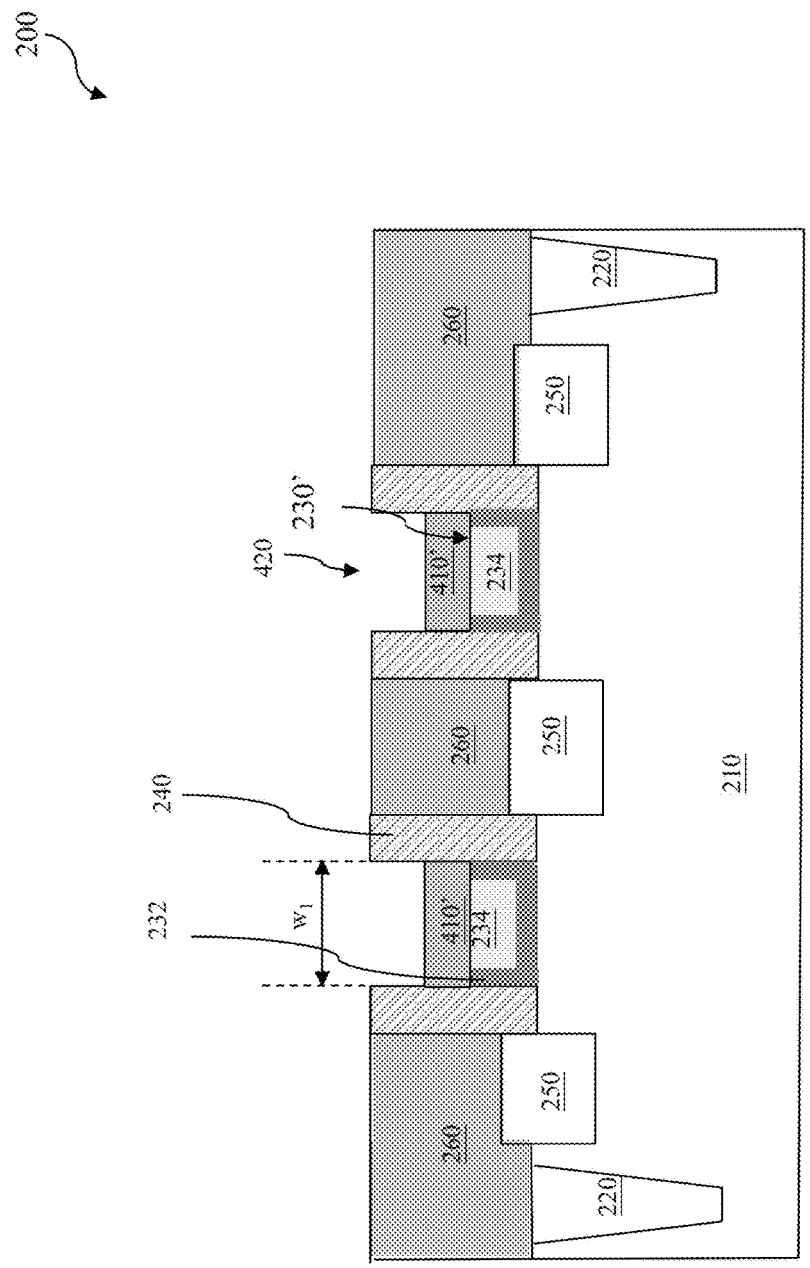

Referring to FIGS. 1 and 5, method 100 proceeds to step 108 by recessing the first HM 410 to form second trenches 420. The remaining first HM 410 is referred to as recessed first HM 410' hereafter. The etch process may include a wet etch, a dry etch, and/or a combination thereof. In the present embodiment, the etch process is chosen to selectively etch the first HM 410 without substantially etching the sidewall spacers 240 and the first dielectric layer 260. The second trenches 420 have the first width $w_1$.

Figure 6:
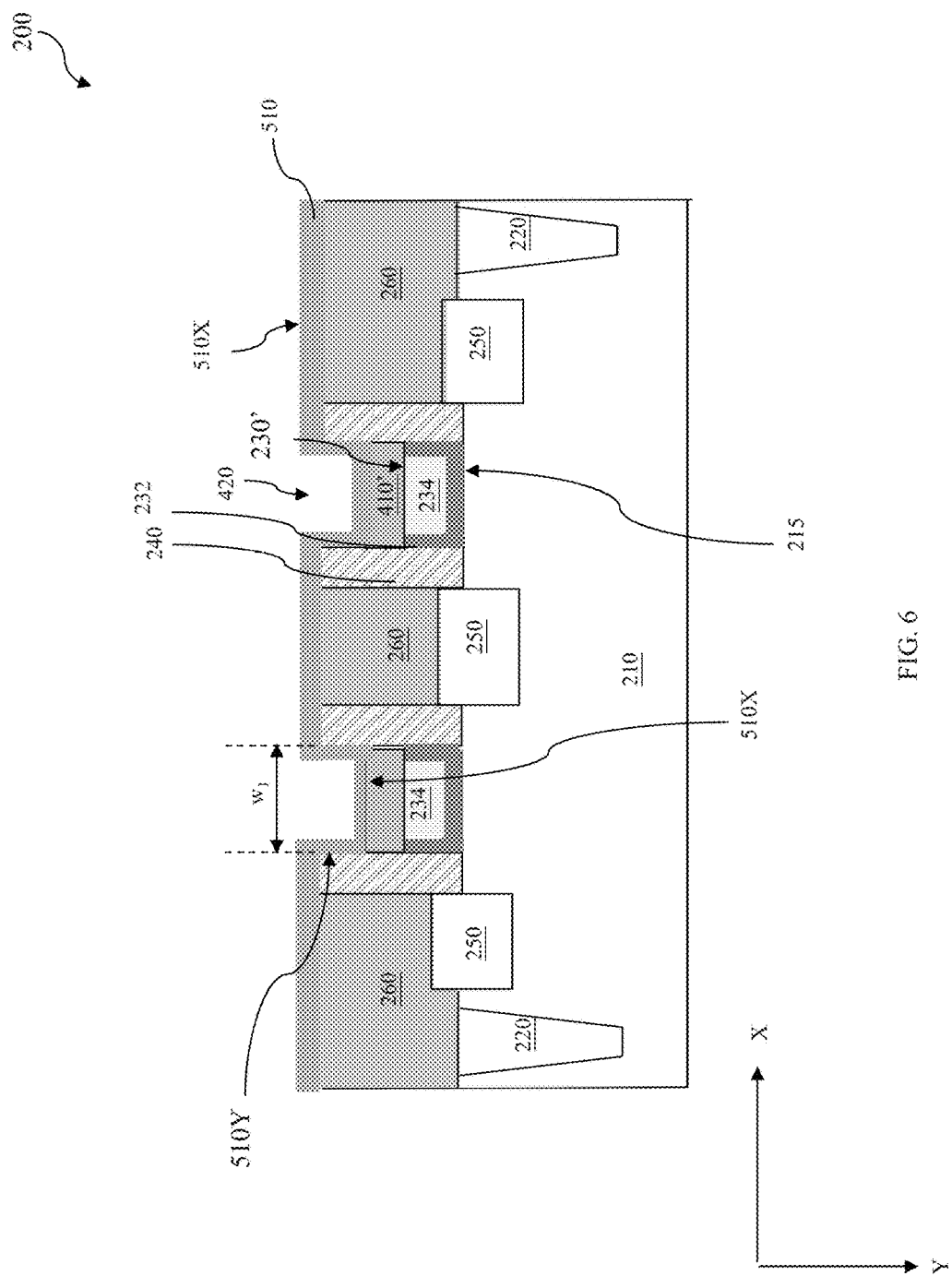

Referring to FIGS. 1 and 6, the method 100 proceeds to step 110 by depositing a first capping layer 510 in second trenches 420, as well as on the top of the first dielectric layer 260 and on the tops of the sidewall spacers 240. The first capping layer 510 may include silicon and/or other suitable material. The first capping layer 510 may be deposited by ALD, PVD, CVD, MOCVD, low-pressure CVD (LPCVD) and/or other suitable technique. In an embodiment, the first capping layer 510 is deposited by ALD. In another embodiment, the first capping layer 510 is deposited by PVD. In yet another embodiment, the first capping layer 510 is deposited by LPCVD.

In the present embodiment, the first capping layer 510 is deposited in the second trench 420 and physically contacts sidewall spacers 240 along sidewalls of the second trenches 420 and physically contacts the recessed first HM 410' at the bottom of the second trenches 420. As a result, the first capping layer 510 includes first portions 510X and second portions 510Y. First portions 510X extend in a first direction (i.e. x-direction) which is substantially parallel to a top surface 215 of substrate 210 and second portions Y extend in a second direction (i.e. y-direction) that is substantially perpendicular to the first direction.

Figure 7:
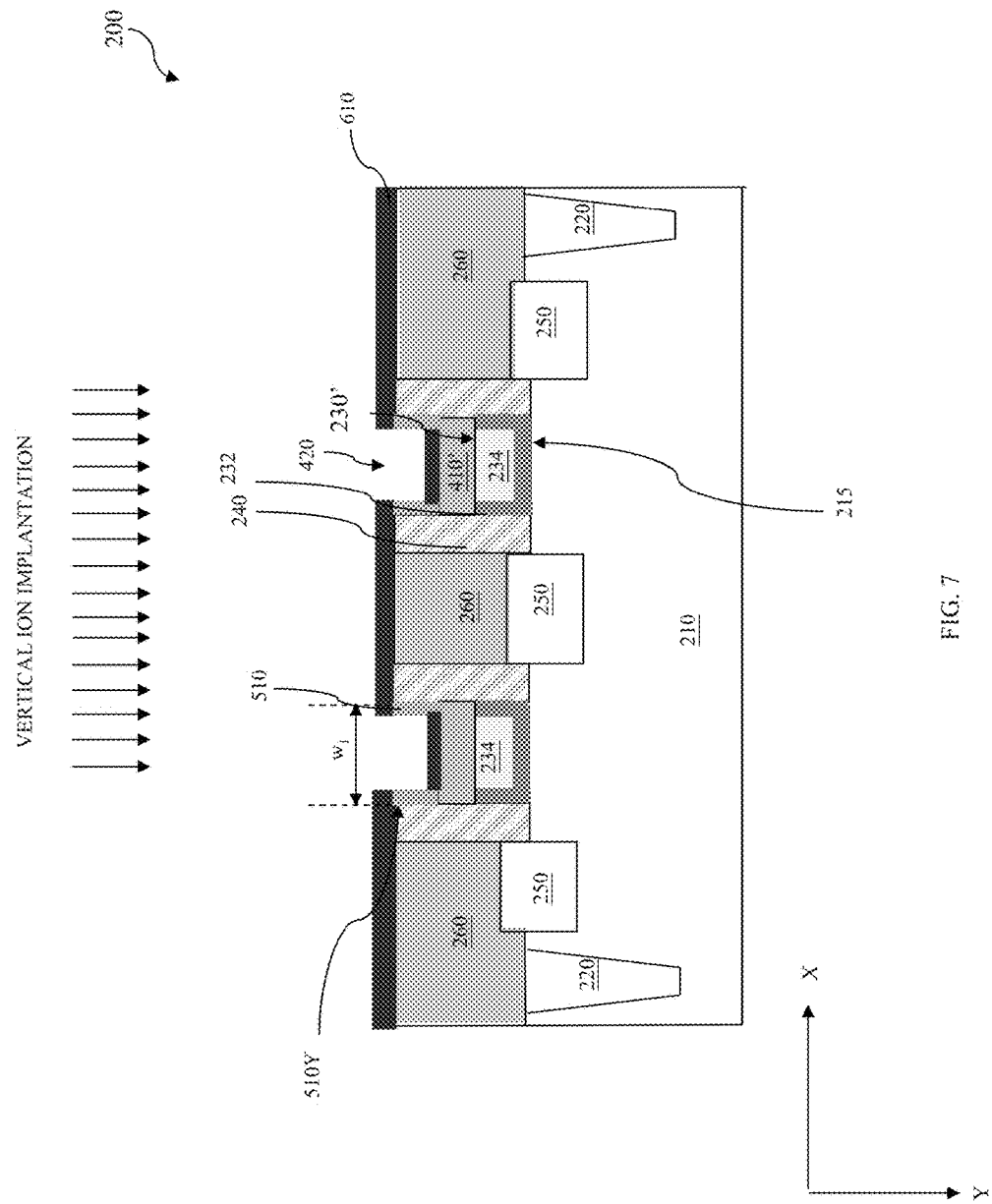

Referring to FIGS. 1 and 7, method 100 proceeds to step 112 by performing a first ion implantation to transform (or convert) the first portions 510X into a second capping layer 610 while the second portions 510Y remain intact. In some embodiments, the first ion implantation includes a vertical (uniformity in vertical direction) ion implantation along Y-direction to convert the first portions 510X into the second capping layer 610 while the second portions 510Y remain intact. In the present embodiment, the first ion implantation introduces ion species into the first portions 510X to reduce the etching rate of the first portions 510X with respect to a target etchant. Particularly, the second capping layer 610 attains a lower etching rate (or a higher etching resistance) with respect to the target etchant than the second portions 510Y. In an embodiment, the first capping layer 510 includes silicon, the ion beam of the first ion implantation includes B ions or $BF_2$ ions, or other capable implantation species, and the target etchant includes $NH_4OH$. Alternatively, the first implantation may include species such as nitrogen, oxygen and fluorine.

Figure 8:
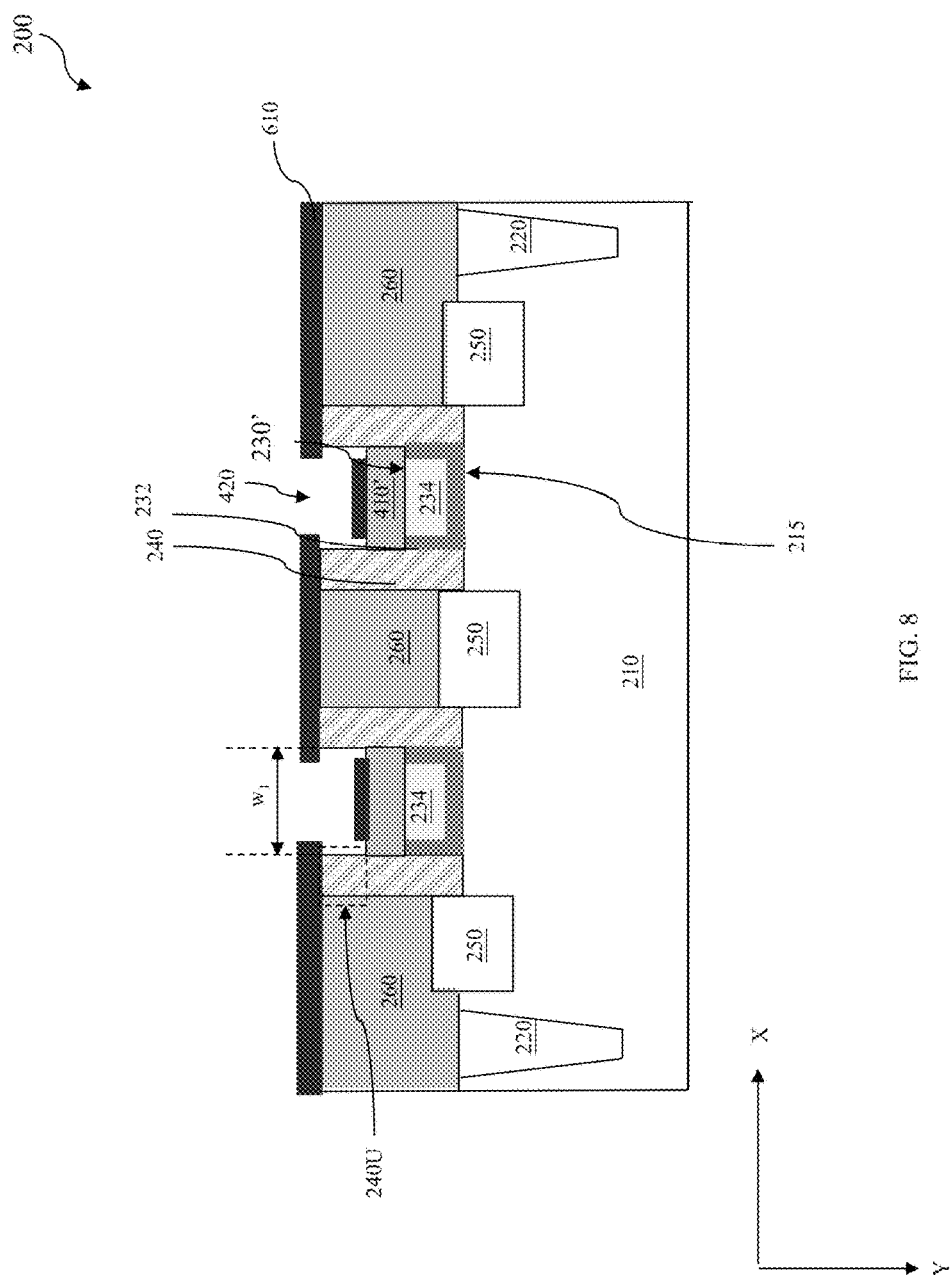

Referring to FIGS. 1 and 8, method 100 proceeds to step 114 by removing the second portion 510Y of the first capping layer 510. In the present embodiment, a selective etch is performed such that the etch process etches the second portion 510Y without substantially etching the second capping layer 610 and the sidewall spacers 240. The selective etch may include a selective wet etch, a selective dry etch, and/or a combination thereof. In an embodiment, a selective wet etch is used to etch the second portion 510Y and the corresponding etchant includes $NH_4OH$. As a result, after removing the second portion 510Y, an upper portion of the sidewall spacers 240 are exposed within the second trenches 420, referred to as 240U.

Figure 9:
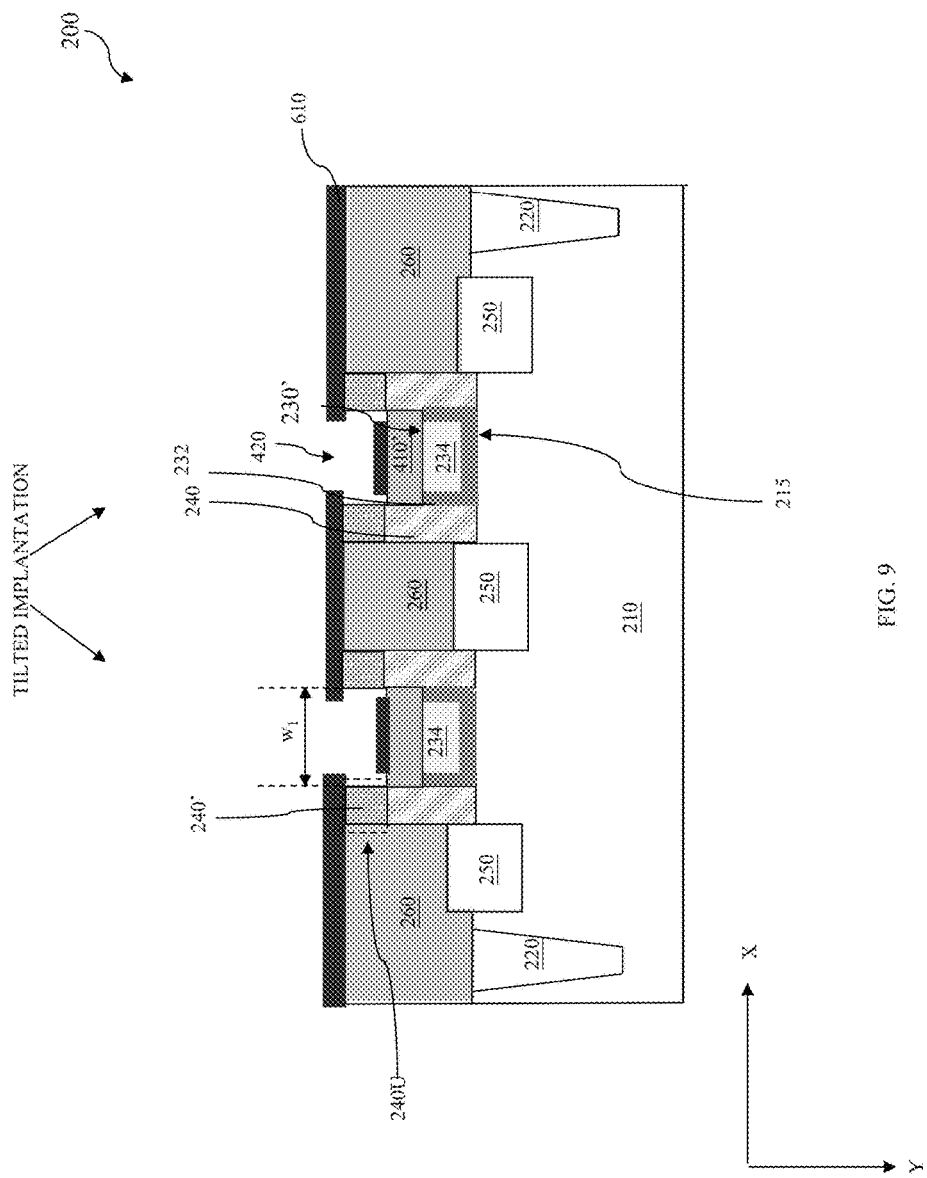

Referring to FIGS. 1 and 9, method 100 proceeds to step 116 by performing a second ion implantation to modify the exposed upper portion 240U into a modified sidewall spacer 240'. The second ion implantation process introduces ion species into the upper portion 240U of sidewall spacer 240 that increase the etching rate of the upper portion 240U when compared to the dielectric layer 260 in a subsequent etch discussed below. Particularly, the second capping layer 610 attains a higher etching rate (or a lower etching resistance) with respect to the target etchant. In an embodiment, the second ion implantation with nitrogen species is applied to modify the exposed upper portion 240U of the low-k SiOC sidewall spacers 240. Alternatively, the second implantation may include species such as oxygen and/or fluorine/or nitrogen/or other proper gas.

In some embodiments, the second ion implantation is a tilted ion implantation applied to the exposed upper portion 240U with a tilt angle. The tilt angle of the second ion implantation process is designed such that the exposed upper portions 240U of the sidewall spacers 240 are modified. Furthermore, the second ion implantation process may include two steps: the first step is an ion implantation with a tilt angle such that the ion beam is toward the left sidewalls defining second trench 420 and the second step is another ion implantation with a tilt angle such that the ion beam is toward the right sidewalls defining second trench 420.

Figure 10:
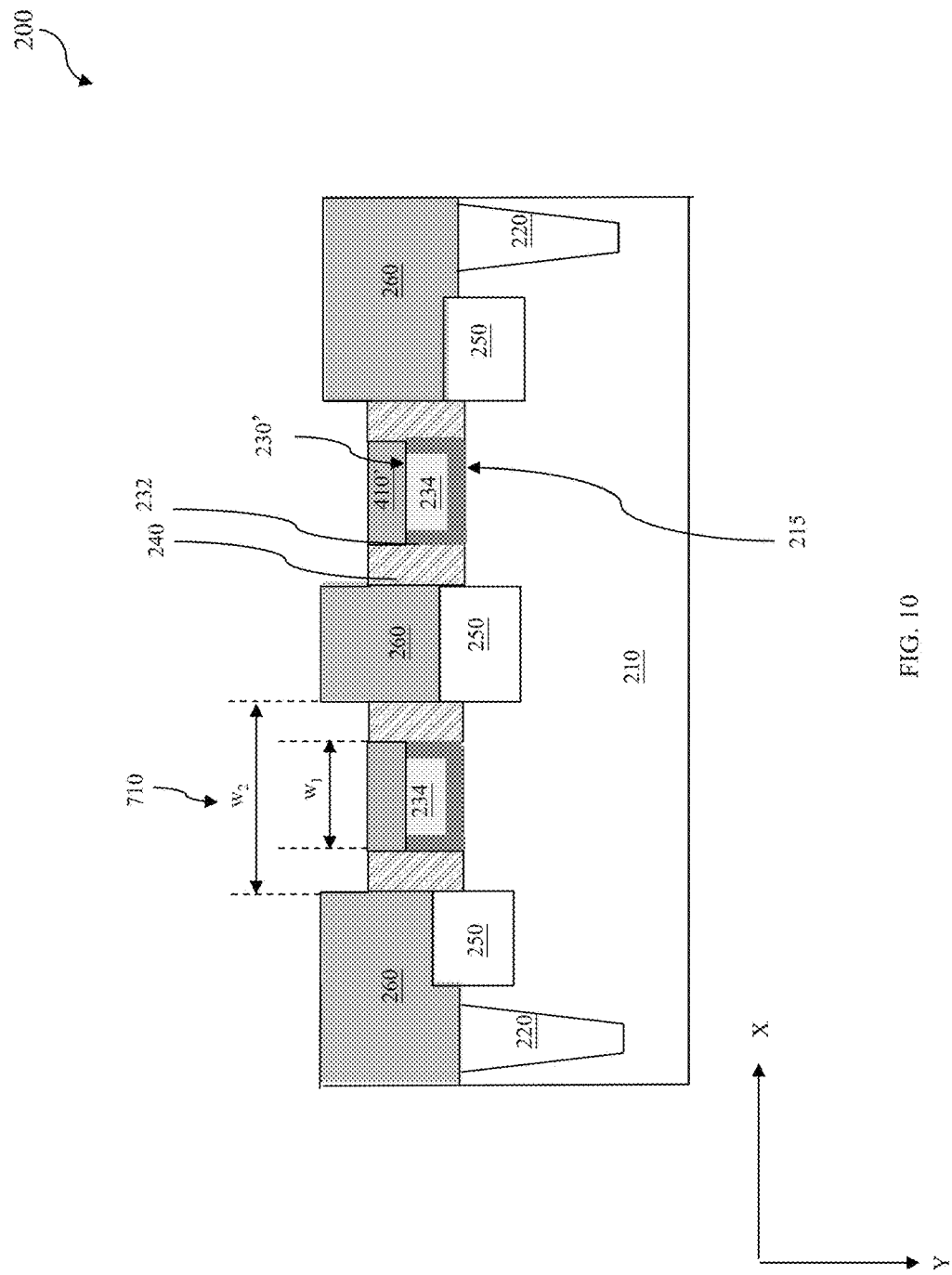

Referring to FIGS. 1 and 10, method 100 proceeds to step 118 by removing the second capping layer 610 and the modified sidewall spacers 240' to form a third trench 710. The etch process may include a selective wet etch, a selective dry etch, and/or a combination thereof. It is important to note that the removal of the modified sidewall spacers 240' occurs without substantial etching to the first dielectric layer 260. However, it is common that the first dielectric layer 260 includes silicon oxide while the sidewall spacers 240 include low-k dielectric layer. Therefore an adequate etching selectivity between the silicon oxide and low-k dielectric layer is challenging to achieve. As has been mentioned previously, in the present embodiment, the modified sidewall spacer 240' has a substantially different etch selectivity as compared to the first dielectric layer 260. Thus, the modified sidewall spacers 240' are removed without substantially etching the first dielectric layer 260. In an embodiment, the etch process is a wet etch with corresponding etchant that includes $H_3PO_4$. As a result, the third trench 710 is formed with a second width $w_2$, which is combining widths of two sidewall spacers 240 and the first width $w_1$ together.

Figure 11:
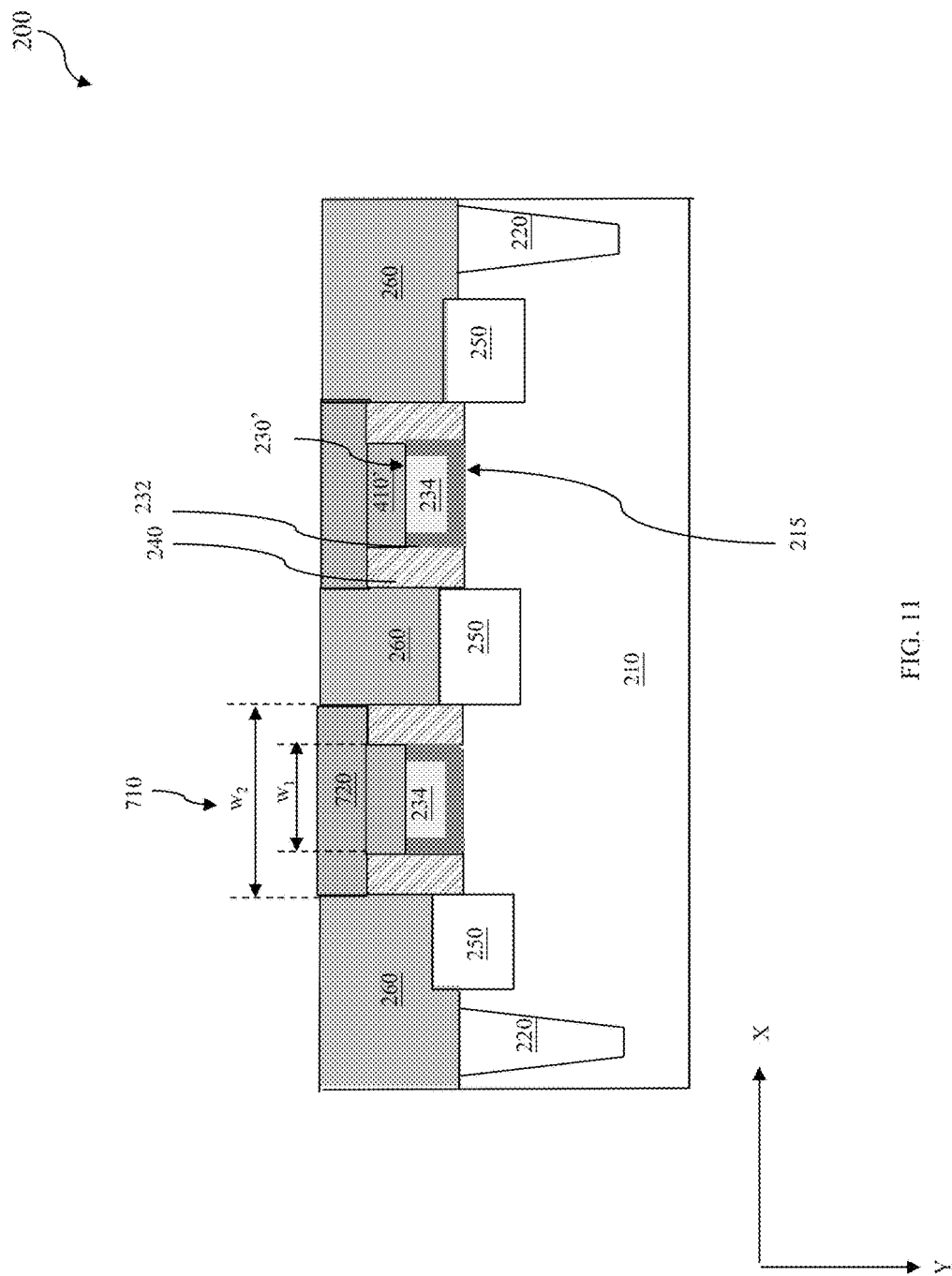

Referring to FIGS. 1 and 11, method 100 proceeds to step 120 by forming a second HM 720 within the third trench 710. In some embodiments, the second HM 720 is formed similarly in many respects to the first HM 410 discussed above association with FIG. 4, including the materials discussed therein. Alternatively, the second HM 720 includes a material which is different than the first HM 420. In the present embodiment, the second HM 720 includes a material which is different from the first dielectric layer 260 to achieve etching selectivity during subsequent etch processes. Additionally, a CMP is performed to remove the excessive second HM 720 that may be formed outside of third trench 710. The remaining second HM 720 has a width same as the second width $w_2$. Because the width of the second HM 720 (namely second width $w_2$) is greater than the recessed HK/MG 230' (namely the first width $w_1$), the second HM 720 is generally referred to as a big-head of the recessed HK/MG 230'. In the present embodiment, the big-head 720 is designed such that it covers the recessed HK/MG230 (with the recessed first HM 410' together) and extends to cover the recessed sidewall spacer 240 to provide an extra protection to the recessed HK/MG 230' in subsequent etching process and extra allowance for subsequent lithography process.

Figure 12:
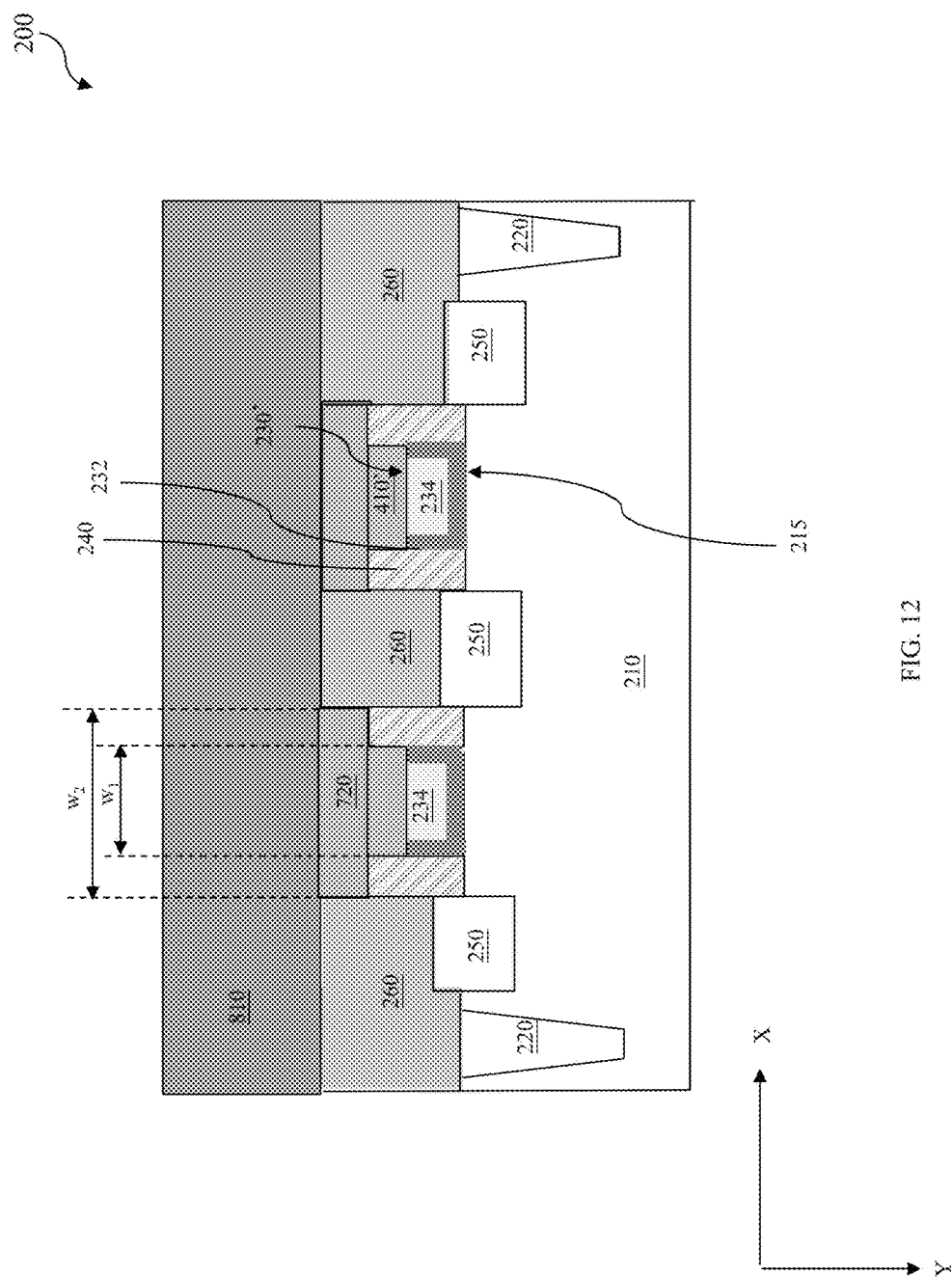

Referring to FIGS. 1 and 12, method 100 proceeds to step 122 by forming a second dielectric layer 810 over the first dielectric layer 260 and the big-head 720. In some embodiment, the second dielectric layer 810 is formed similarly in many respects to the first dielectric layer 260, including the materials discussed therein. In the present embodiment, the second dielectric layer includes a material which is different from the big-head 720 to achieve etching selectivity during subsequent etch processes.

Figure 13:
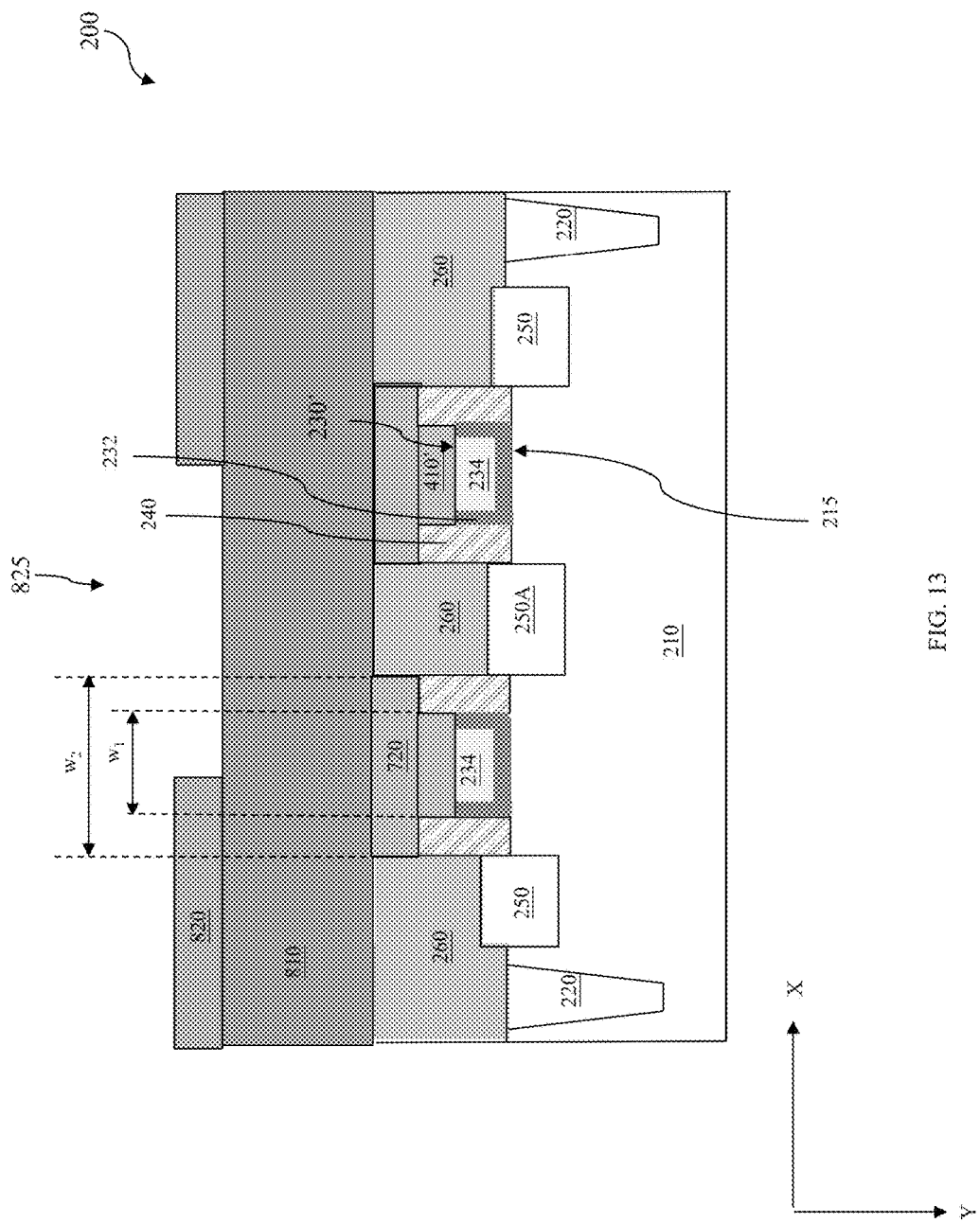

Referring to FIGS. 1 and 13, method 100 proceeds to step 124 by forming a patterned HM 820 over the second dielectric layer 810. The patterned HM 820 has an opening 825 aligned to a designated S/D feature 250, referred to as 250A. In some embodiments, the opening 825 has a larger width such that it extends to align to a portion of the adjacent big-head 720 to obtain advantages, such as relaxing lithography process resolution constrains, especially when the device 200 scales down such that a dimension of source/drain feature 250 becomes smaller and smaller.

In some embodiments, the patterned HM 820 may include a patterned photoresist layer and formed by a by a lithography process. An exemplary lithography process may include forming a photoresist layer, exposing the photoresist layer by a lithography exposure process, performing a post-exposure bake process, and developing the photoresist layer to form the patterned resist layer. Alternatively, the patterned HM 820 may be formed by depositing a HM layer, forming a patterned photoresist layer over the HM layer by a lithography process and etching the HM material layer through the patterned photoresist layer to form the patterned HM 820.

Figure 14A:
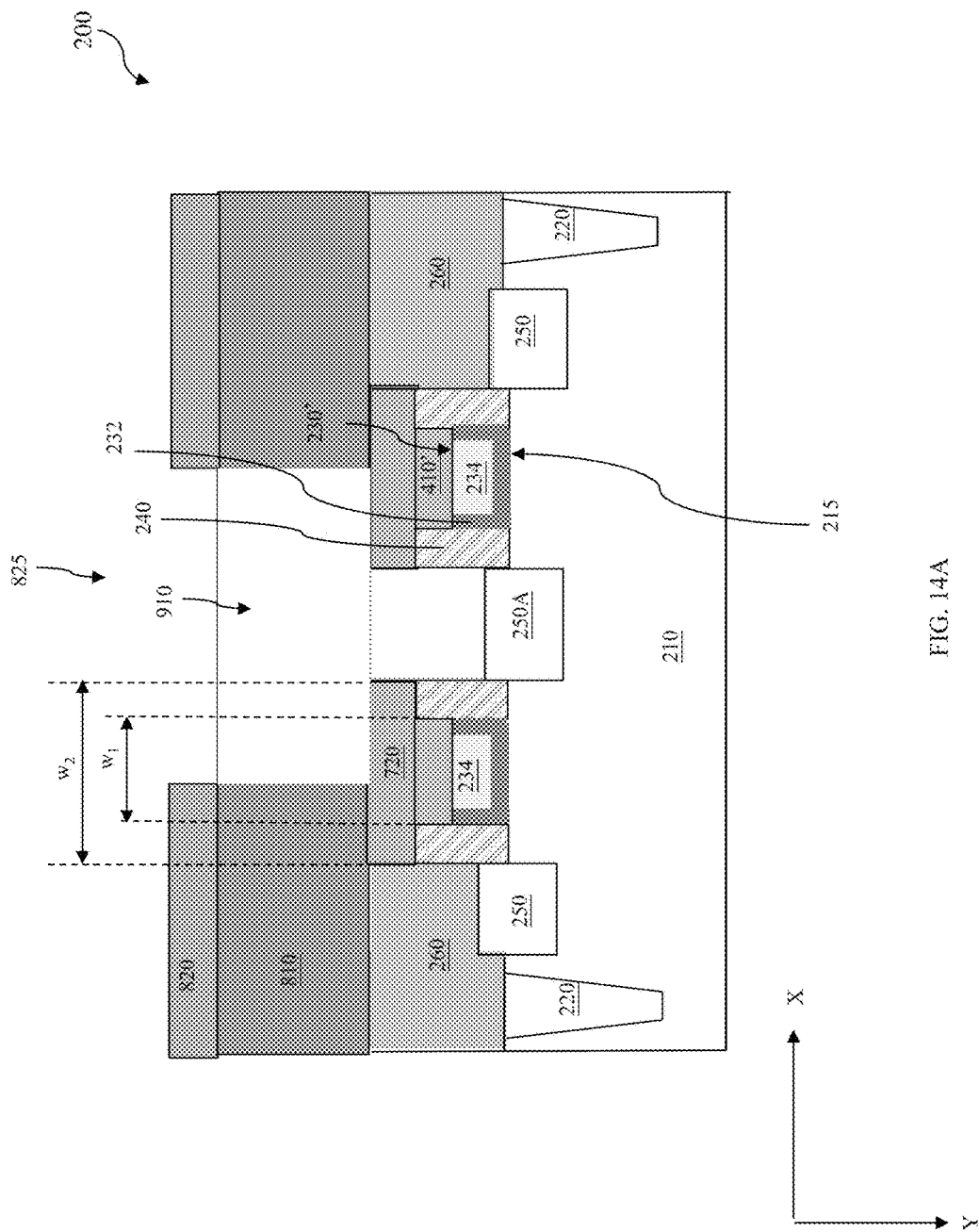

Referring to FIGS. 1 and 14A, method 100 proceeds to step 126 by etching the second and first dielectric layers, 810 and 260, through the opening 825 to form a contact trench 910. In the present embodiment, the contact trench 910 extends toward the S/D feature 250A. The etch process may include a wet etch, a dry etch, and/or a combination thereof. As an example, a dry etching process may implement fluorine-containing gas (e.g., $CF_4$, $SF_6$, $CH_2F_2$, $CHF_3$, and/or $C_2F_6$), other suitable gases and/or plasmas, and/or combinations thereof. In some embodiment, the trench etch process is chosen to selectively remove the second and the first dielectric layers, 810 and 260, without substantially etching the big-head 720. As shown, the exposed portions of the big-head 720 serve as a sub-etch-mask to provide protection to the sidewall spacer 240 and the recessed HK/MG 230' (with the recessed first HM 410' together). With the adequate etch selectivity, the contact trench 910 is formed with a self-alignment nature, which further relaxes process constrains.

Figure 14B:
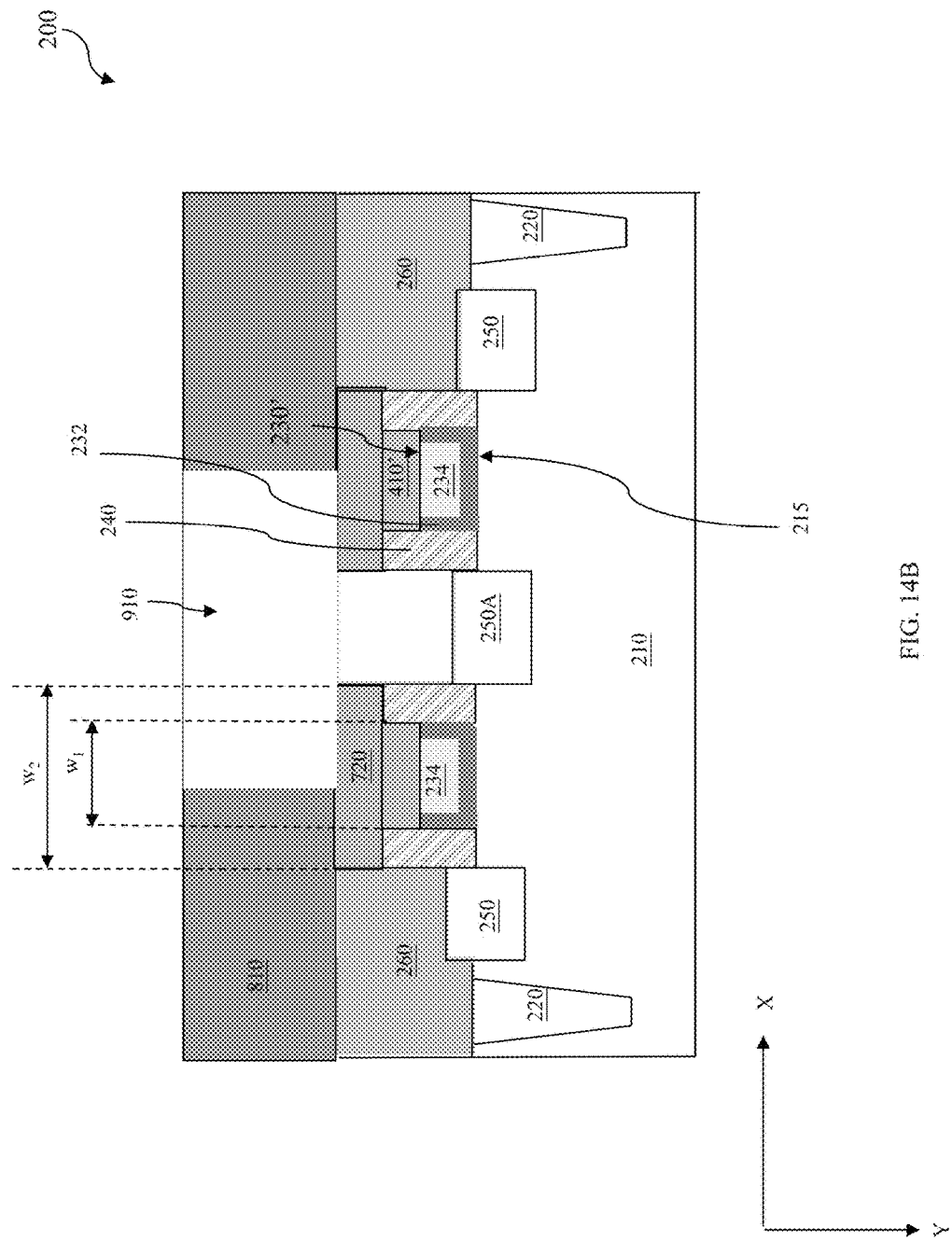

After forming the contact trench 910, the patterned HM 820 is removed by an etch process, as shown in FIG. 14B. In one example where the patterned HM 820 is a photoresist pattern, the patterned HM 820 is removed by wet stripping and/or plasma ashing.

Figure 15A:
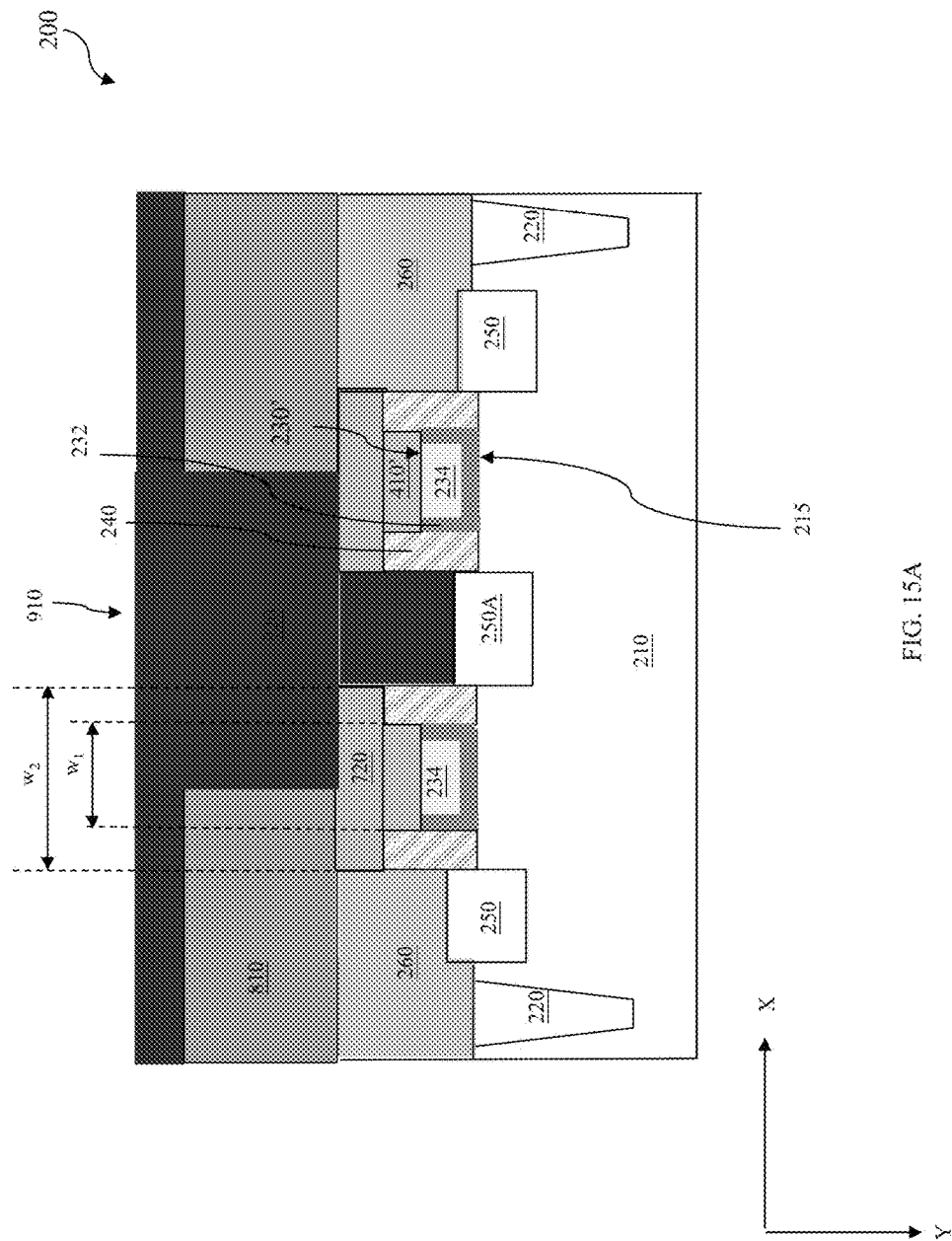

Referring to FIGS. 1 and 15A, the method 100 proceeds to step 128 by depositing a conductive layer 920 in the contact trench 910. As shown, the conductive layer 920 extends toward the S/D features 250A. The conductive layer 920 may include metal layer, such as copper (Cu), aluminum (Al), tungsten (W), copper, copper magnesium (CuMn), copper aluminum (CuAl) or copper silicon (CuSi), and/or other suitable conductive material. (TaSiN). The conductive layer 920 may be deposited by PVD, CVD, metal-organic chemical vapor deposition (MOCVD), or plating.

Figure 15B:
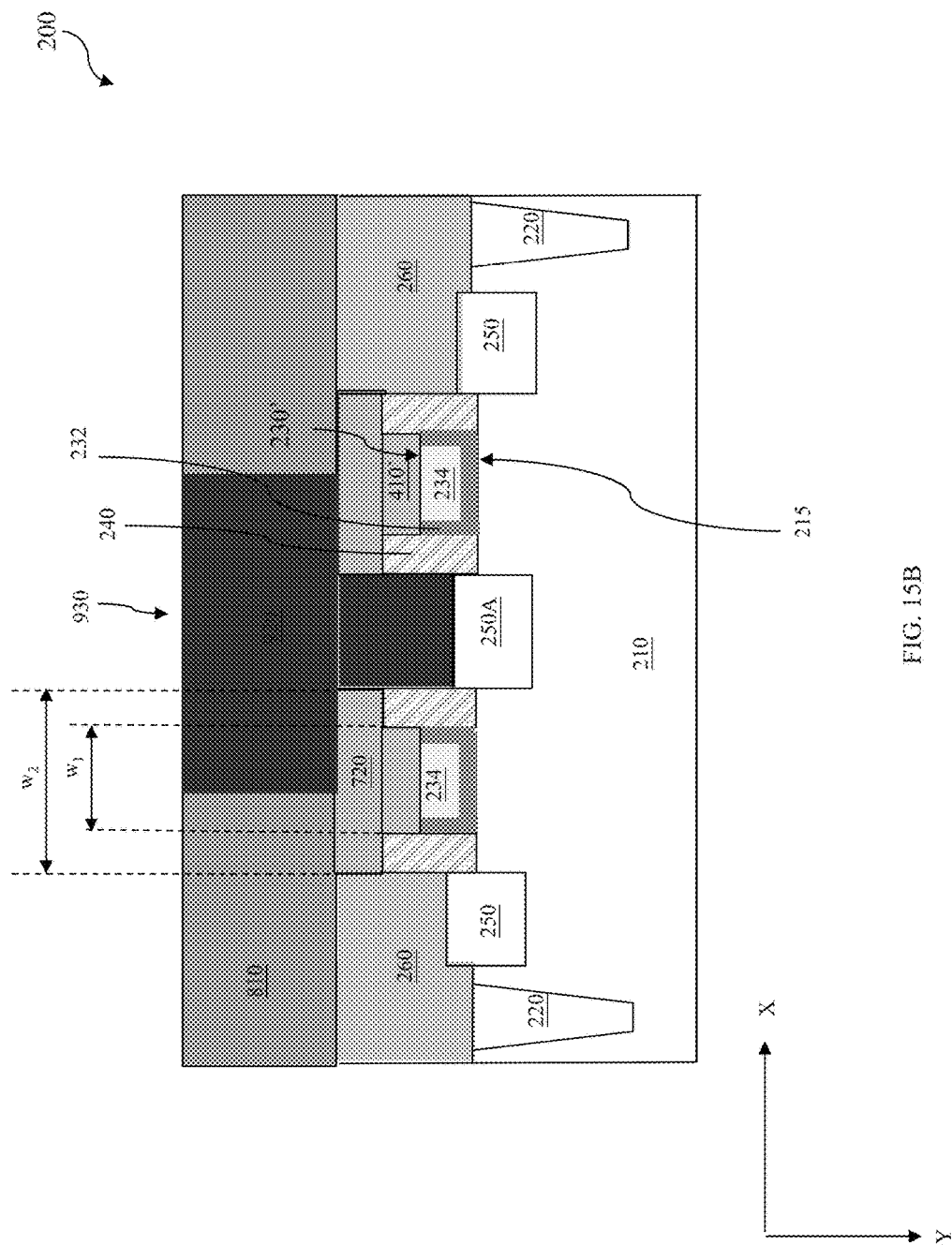
Figure 16A:
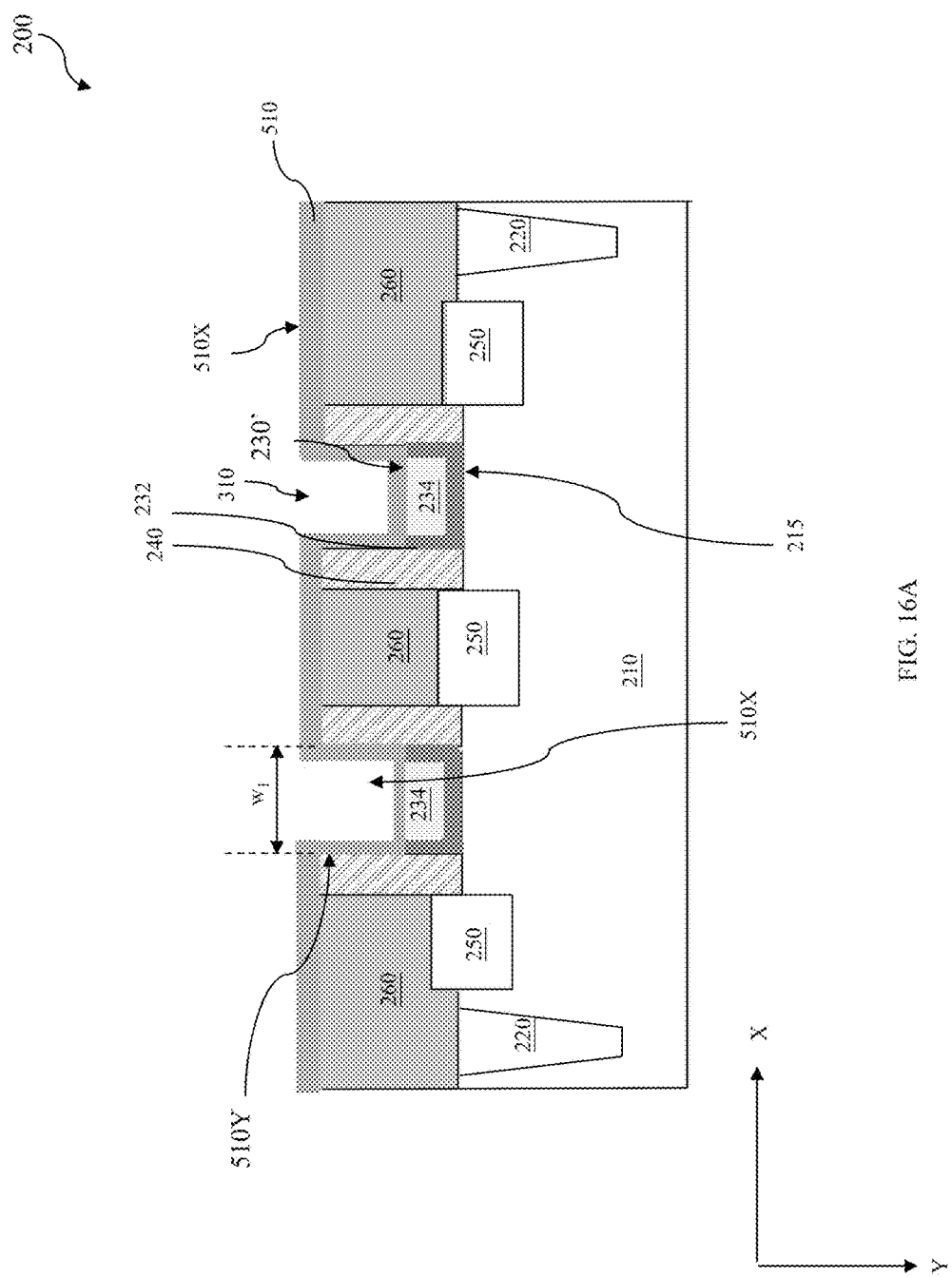
Figure 16B:
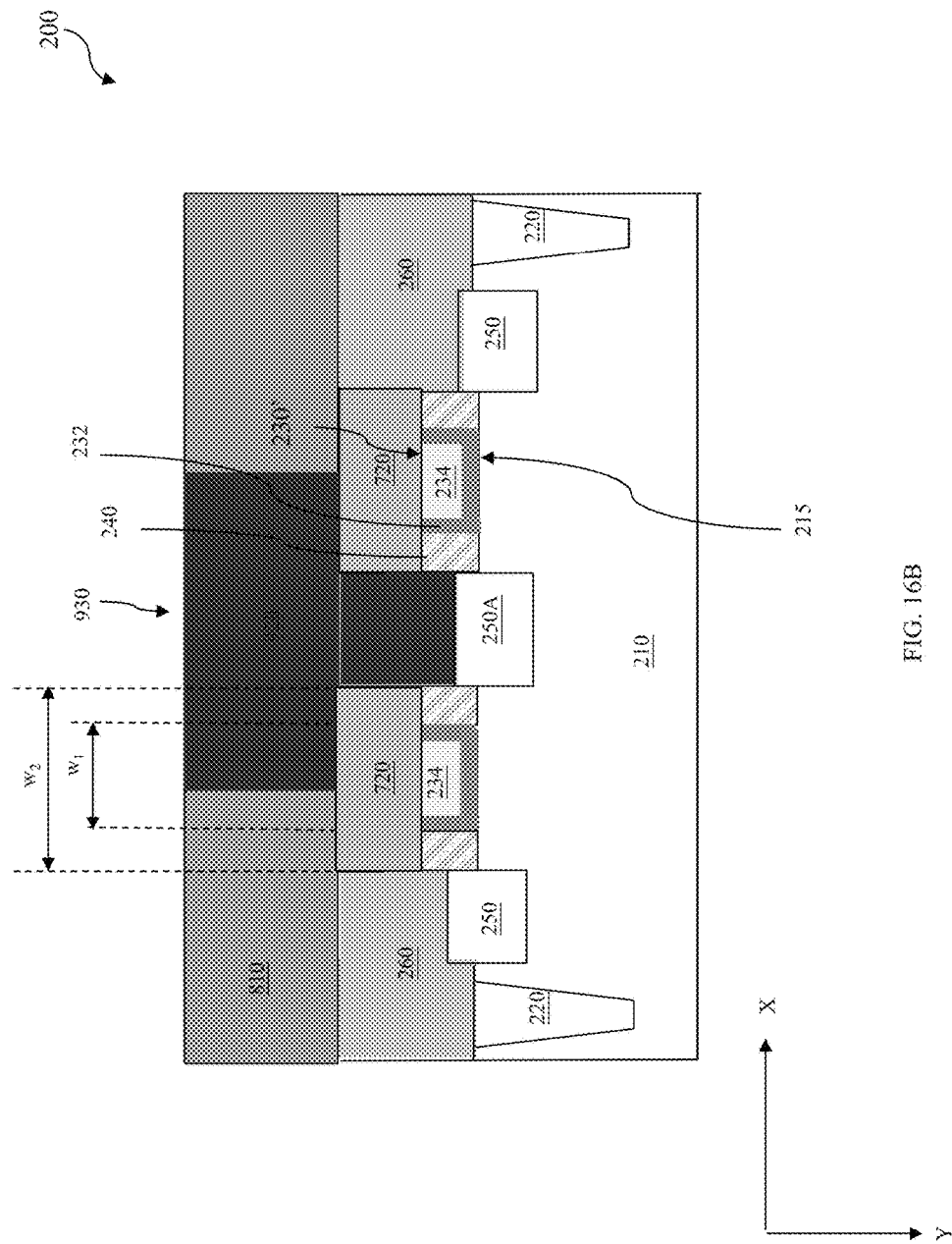

In some embodiments, a CMP process is performed to remove the excessive conductive layer 920 to forms a conductive feature 930, as shown in FIG. 15B. Thus, the conductive feature 930 physically contacts the S/D feature 250A while it separates from the recessed HK/MGs 230', adjacent to the S/D feature 250A, by the sidewall spacers 240 and the big-heads 720, respectively.

Additional steps can be provided before, during, and after the method 100, and some of the steps described can be replaced, eliminated, or moved around for additional embodiments of the method 100. For an example, in an embodiment, step 106 (forming a first hard mask (HM) 410 in the first trenches 310) and step 108 (recessing the first HM 410 to form second trenches 420) are eliminated and then the process flow continues with step 110 of the method 100. As a result, referring to FIG. 16A, at step 110, the first capping layer 510 is formed in the first trenches 310 (instead of second trenches 420), as well as on the top of the first dielectric layer 260 and on the tops of the sidewall spacers 240. The first capping layer 510 physically contacts sidewall spacers 240 along sidewalls of the first trenches 310 (instead of second trenches 420) and the recessed first HM 410' at the bottom of the first trenches 310 (instead of second trenches 420). The process flow continues with rest of steps of the method 100 (step 112 through step 128), without departing from the spirit and scope of the present disclosure. Therefore, referring to FIG. 16B, the big-head 720 covers and physically contacts the recessed HK/MG230' and extends to cover the recessed sidewall spacer 240. The big-head 720 has the second width $w_2$, which is greater than a width of the recessed HK/MG 230' (namely the first width $w_1$).

The semiconductor devices, 200, may include additional features, which may be formed by subsequent processing. For example, various vias/lines and multilayers interconnect features (e.g., metal layers and interlayer dielectrics) are formed over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provide methods of forming a source/drain contact. The method employs modifying an upper portion of the sidewall spacer such that it obtains etching selectivity with respect to the dielectric layer during recessing sidewall spacer. The method also employs forming a big-head HM over the gate stack to provide additional protection for the gate stack during forming source/drain contact. The method provides a robust contact formation process with self-alignment nature to relax process constrains.

The present disclosure provides many different embodiments of fabricating a semiconductor device that provide one or more improvements over existing approaches. In one embodiment, a method for fabricating a semiconductor device includes forming a first gate stack over a substrate, forming spacers along sidewalls of the first gate stack, forming dielectric layer around the first gate stack, recessing the first gate stack to form a first trench defined by the spacers. The first trench has a first width, wherein an upper portion of the spacer is exposed within the first trench. The method also includes forming a first capping layer in the first trench such that the first capping layer has a first portion disposed over the exposed spacers along sidewalls of the first trench and a second portion disposed over the recessed first gate stack. The method also includes applying a first implantation to convert the second portion of the first capping layer into a second capping layer, removing the first portion of the capping layer to expose the upper portion of the spacers while the second capping layer is disposed over the recessed first gate stack, applying a second implantation to modify the exposed upper portion of the spacers, selectively removing the modified upper portion of spacers to form a second trench. The second trench has a second width that is greater than the first width. The method also includes forming a hard mask layer in the second trench.

In yet another embodiment, a method includes forming a first gate stack over a substrate, forming spacers along sidewalls of the first gate stack. The spacers include low-k dielectric material. The method also includes forming a first dielectric layer over the substrate, including between the first gate stack and the second gate stack. The method also includes recessing the first gate stack to form a first trench. A portion of the spacers is exposed within the first trench. The method also includes forming a first capping layer in the first trench such that a first portion of the first capping layer is disposed over the portion of the spacers and a second portion is disposed over the recessed first gate stack. The method also includes applying a first implantation to convert the second portions of the first capping layer into a second capping layer. After the first implantation the first portion of the capping layer disposed over the portion of the spacers is different than the second capping layer disposed over the recessed first gate stack. The method also includes removing the first portion of the first capping layer to expose the portion of the spacers while the second capping layer is disposed over the recessed first gate stack, applying a second implantation to modify the portion of the spacers, removing the modified portion of the spacers to form second trenches and forming a hard mask layer in the second trenches.

In yet another embodiment, a semiconductor device includes a first gate stack disposed over a substrate, a first spacer disposed along a sidewall of a first side of the first gate stack and a second spacer disposed along a sidewall of a second side of the first gate stack. The second side opposes the first of the first gate stack. The device also includes a hard mask layer disposed over the first gate stack and extends over the first spacer and the second spacer. The hard mask has a width which is greater than a width of the first gate stack. The device also includes a conductive layer disposed over the first side of the first gate stack. The conductive layer is separated from the first gate stack by the first spacer and the hard mask layer. The device also includes a dielectric layer disposed over the second side of the first gate stack. The dielectric layer physically contacts the conductive layer, the hard mask layer and the second spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate structure in a dielectric layer over a substrate, wherein the first gate structure includes a first gate stack and spacers along sidewalls of the first gate stack;
   recessing the first gate stack to form a first trench defined by the spacers, wherein the first trench has a first width, wherein upper portions of the spacers are exposed within the first trench;
   forming a first capping layer in the first trench, wherein the first capping layer has a first portion disposed along sidewalls of the upper portions of the spacers and a second portion disposed over the recessed first gate stack;
   applying a first implantation to convert the second portion of the first capping layer into a second capping layer;
   selectively removing the first portion of the capping layer to expose the upper portions of the spacers while the second capping layer is disposed over the recessed first gate stack; and
   selectively removing the upper portions of the spacers to form a second trench, wherein the second trench has a second width that is greater than the first width.

2. The method of claim 1, wherein the applying of the first implantation includes applying a vertical ion implantation that is perpendicular to a top surface of the substrate.

3. The method of claim 2, wherein applying the vertical ion implantation includes applying the vertical ion implantation with boron species to the second portion of the first capping layer.

4. The method of claim 1, wherein the selectively removing of the upper portions of the spacers includes
   applying a second implantation to modify the upper portions of the spacers; and
   selectively removing the modified upper portions of the spacers to form the second trench.

5. The method of claim 4, wherein the applying of the second implantation includes applying a tilted ion implantation to the upper portion of the spacer with nitrogen species.

6. The method of claim 4, further comprising
   forming a first hard mask layer in the first trench, prior to the forming of the first capping layer in the first trench; and
   forming a second hard mask layer in the second trench, after the selectively removing of the upper portions of the spacers.

7. The method of claim 6, further comprising:
   after the selectively removing of the modified upper portion of spacers to form the second trench, extending the second trench into outside of spacers.

8. The method of claim 7, further comprising:
   forming a second gate stack over the substrate, wherein the dielectric layer separates the second gate stack from the first gate stack;
   forming a source/drain feature over the substrate, wherein the source/drain feature is disposed between the first gate stack and the second gate stack, wherein the dielectric layer is disposed over the source/drain feature;
   after forming the second hard mask layer, forming a second dielectric layer over the first dielectric layer and the second hard mask layer;
   forming a contact hole in the second dielectric layer that extends through the first dielectric layer to expose the source/drain feature; and
   filling a conductive layer in the contact hole.

9. The method of claim 8, wherein forming a contact hole includes:
forming a patterned hard mask over the second dielectric layer, wherein the patterned hard mask has an opening aligned with the source/drain feature; and
etching the second and first dielectric layers through the opening by using the patterned hard mask as an etch mask.

10. A method comprising:
forming a first gate stack over a substrate spacers along sidewalls of the first gate stack, wherein the spacers include a low-k dielectric material;
forming a first dielectric layer over the substrate and on sidewalls of the spacers;
recessing the first gate stack to form a first trench, wherein a portion of the spacers is exposed within the first trench;
forming a first capping layer in the first trench such that a first portion of the first capping layer is disposed over the portion of the spacers and a second portion is disposed over the recessed first gate stack;
applying a first implantation to convert the second portions of the first capping layer into a second capping layer, wherein the second capping layer is different from the first portion of the capping layer;
removing the first portion of the first capping layer to expose the portion of the spacers while the second capping layer is disposed over the recessed first gate stack;
applying a second implantation to modify the portion of the spacers; and
selectively removing the modified portion of the spacers to form second trenches.

11. The method of claim 10, wherein applying the first implantation includes applying the first implantation with a vertical ion implantation that is perpendicular to a top surface of the substrate.

12. The method of claim 11, wherein applying the vertical ion implantation includes applying the vertical ion implantation process with boron species to the second portions of the first capping layer.

13. The method of claim 10, wherein applying the second implantation includes a tilted ion implantation applied to the portion of the spacers with a tilt angle.

14. The method of claim 13, wherein applying the tilted ion implantation includes applying the tilted ion implantation with nitrogen species to the portion of the spacers.

15. The method of claim 10, further comprising
forming a first hard mask layer in the first trench prior to forming the first capping layer in the first trench; and
forming a second hard mask layer in the second trench prior to the forming of the first capping layer in the first trench after the selectively removing of the modified portion of the spacers to form second trenches.

16. The method of 15, further comprising:
forming a source/drain feature over the substrate, wherein first dielectric layer disposed over the source/drain feature;
after forming the hard mask layer in the second trench, forming a second dielectric layer over the first dielectric layer and the hard mask layer;
forming a contact hole in the second dielectric layer that extends through the first dielectric layer and exposes the source/drain feature; and
forming a conductive layer in the contact hole.

17. The method of claim 10, further comprising:
after the selectively removing of the modified upper portion of spacers to form the second trench, extending the second trench to outside of spacers.

18. A method comprising:
forming a gate structure in a first dielectric layer over a substrate, wherein the gate structure includes a gate stack and opposing sidewall spacers disposed along sidewalls of the gate stack;
removing a first portion of the gate stack to form a first trench extending between the opposing sidewall spacers, wherein a second portion of the gate stack remains after removing the first portion of the gate stack;
removing a portion of the opposing sidewall spacers;
forming a first capping layer over the second portion of the gate stack;
forming a second dielectric layer over the first capping layer;
forming a contact trench through the second dielectric layer; and
forming a contact within the contact trench.

19. The method of claim 18, further comprising:
forming a second capping layer within the first trench such that a first portion of the second capping layer is disposed over the opposing sidewall spacers and a second portion is disposed over the second portion of the gate stack;
applying a first implantation to convert the second portion of the second capping layer into a third capping layer, wherein the third capping layer is different from the first portion of the second capping layer;
removing the first portion of the second capping layer to expose the opposing sidewall spacers while the third capping layer is disposed over the second portion of the gate stack;
applying a second implantation to modify a portion of the opposing sidewall spacers; and
removing the modified portion of the opposing sidewall spacers to form a second trench.

20. The method of claim 18, further comprising forming a source/drain feature in the substrate, and
wherein forming the contact within the contact trench includes the contact extending to the source/drain feature.

* * * * *